United States Patent [19]

Shinomiya

[11] Patent Number: 4,996,417
[45] Date of Patent: Feb. 26, 1991

[54] COLOR FILTER DEVICE
[75] Inventor: Kohji Shinomiya, Itami, Japan
[73] Assignee: Mitsubishi Denki Kabushiki Kaisha, Tokyo, Japan
[21] Appl. No.: 403,878
[22] Filed: Sep. 7, 1989
[30] Foreign Application Priority Data Jun. 13, 1989 [JP] Japan .................................. 1-150883

[51] Int. Cl.$^5$ .............................................. G01J 3/50
[52] U.S. Cl. .................................. 250/226; 250/208.2
[58] Field of Search .................. 250/226, 578.1, 208.2, 250/210, 214 R; 356/416, 419, 406, 414; 209/582, 581, 580

[56] References Cited

U.S. PATENT DOCUMENTS 3,821,550 6/1974 Priest .................................... 250/226
4,095,696 6/1978 Sherwood ........................... 209/581
4,379,636 4/1983 Yoshida ............................... 209/582

FOREIGN PATENT DOCUMENTS 583485 6/1981 Japan .
58151793 3/1982 Japan .
6321523 7/1986 Japan .
6385601 9/1986 Japan .

Primary Examiner—David C. Nelms
Attorney, Agent, or Firm—Oblon, Spivak, McClelland, Maier & Neustadt

[57] ABSTRACT

The present invention relates to a color filter device employed in a color temperature sensor or the like. In the color filter device of the present invention, photoelectric currents caused by lights transmitted through color filter elements are electrically synthesized and a resultant photoelectric current is used to obtain an output characteristic thereof. Therefore, using existing color filter members, a color filter having a new filtering characteristic can be provided.

10 Claims, 6 Drawing Sheets

COLOR FILTER DEVICE

BACKGROUND OF THE INVENTION

1. Field of the Invention

The present invention relates to a color filter device and, more particularly, it relates to a color filter device which serves as a color filter having a new filtering characteristic by utilizing existing color filter material.

2. Description of the Background Art

FIG. 7 is a diagram showing a construction of a color temperature sensor incorporated in a sensing auto white balance device for a camera to which a conventional color filter device is applied.

In this color temperature sensor E, a red color filter element 1R, a green color filter element 1G and a blue color filter element 1B are provided in pairs with photodiodes 2R, 2G and 2B, respectively, as shown in FIG. 7. Incident light passes the color filter elements 1R, 1G, 1B to the photodiodes 2R, 2G, 2B. The photodiodes 2R, 2G, 2B photoelectrically transfer the incident light into a photoelectric current. A cathode and an anode of the photodiodes 2R, 2G, 2B are individually connected to a noninverting input terminal (+) and an inverting input terminal (−) of operational amplifiers 3. Each of the operational amplifiers 3 should have a sufficiently high input impedance in impedance characteristic so that the input bias current is sufficiently small to the photoelectric current. A diode 4 is connected between the output terminal and the inverting input terminal of the operational amplifier 3 for logarithmically compressing the photoelectric current and transferring it into voltage. A constant voltage source 5 is connected to the noninverting input terminal (+) of the operational amplifier 3 for setting a reference voltage in logarithmically compressing the photoelcrtic current and transferring it into voltage while output terminals 6R, 6G, 6B are connected to the output terminals of the operational amplifiers 3 for outputting voltages generated by logarithmic compression in the diodes 4, respectively.

The operation of the color temperatures sensor E will now be described. Light transmitted through the red color filter element 1R, for example, is incident on the photodiode 2R, and the photodiode 2R photoelectrically transfers the incident light into a photoelectric current. Specifically, the photoelectric current flows from a positive electrode of the constant voltage source 5 through the photodiode 2R and the diode 4 to the output terminal of the operational amplifier 3. Negative feedback is used in the operation amplifier 3 with the diode 4, so that the voltage difference between the noninverting input (+) and inverting input (−) is zero. Consequently, flow of the photoelectric current in the diode 4 causes a voltage drop, and a resultant voltage is obtained at the output terminal 6R. Thus, the photoelectric current, which is generated with the incident light transmitted through the red color filter element 1R, is transferred into the voltage compressed logarithmically, and the voltage is outputted from the output terminal 6R. Similarly, the photoelectric current, which is generated with the incident light transmitted through the green color filter element 1G, is transferred into the voltage compressed logarithmically, and the voltage is outputted from the output terminal 6G. Also, the photoelectric current, which is generated with the incident light transmitted through the blue color filter element 1B, is transferred into the voltage compressed lograithmically, and the voltage is outputted from the output terminal 6B.

In the conventional color temperature sensor E, the output voltages from the output terminals 6R, 6G, 6B are set using the repective color filter elements 1R, 1G, 1B. As a result, if the spectral characteristic of the color temperature sensor E is changed so as to obtain natural tone of color in a TV camera or to suit it to the characteristic of a camera device, for example, a novel color filter element having required filtering characteristic must be developed. For the development of such a novel color filter element, various characteristics of the color filter element such as heat resistance, light resistance, moisture resistance, vibration resistance and reliability (deterioration due to changes with time) must be evaluated while various investigations must be done. This requires a great deal of labor and development costs.

SUMMARY OF THE INVENTION

The present invention relates to a color filter device employed in a color temperature sensor or the like.

A color filter device as a first aspect according to the present invention comprises a plurality of color filter elements each of which has indivdual filtering characteristic; a photoelectric transfer circuit having a plurality of photodiodes electrically connected in parallel in pairs with the plurality of color filter elements, for synthesizing photoelectric currents caused by photoelectric transfer of the photodiodes and for outputting a resultant photoelectric current; and a current-voltage transfer circuit for transferring a current of a signal outputted from the photoelectric transfer circuit into a voltage thereof.

A color filter device as a second aspect according to the present invention comprises a photodiode region including a first conductivity type semiconductor region and a second conductivity type semiconductor region selectively formed on the upper portion of the first conductivity type semiconductor region; a first translucent insulation film which is formed coveting the photodiode region from the first conductivity type semiconductor region to the second conductivity type semiconductor region; a first wiring layer formed on the first insulation film and electrically connected to the first conductivity type semiconductor region through a contact hole provided in the first insulation film; a second wiring layer formed on the first insulation film and electrically connected to the second conductivity type semiconductor region through a contact hole provided in the fist insulation film; a second translucent insulation film formed on the first insulation film with covering the first and second wiring layers; a light screening film formed on the second insulation film and provided with a plurality of openings in a region corresponding to the second conductivity type semiconductor region, and a plurality of color filter layers which are formed on the second insulation film through the plurality of openings respectively and each of which has individual filtering characteristic.

Accordingly, it is an object of the present invention to provide a color filter device which serves as a color filter having a new filtering characteristic, using existing color filter elements.

In the color filter device according to the first aspect, lights transmitted through the color filter elements are incident on the photodiodes in pairs with the color filter elements and are photoelectrically transferred, respectively. Produced photoelectric currents are electrically synthesized and a resultant photoelectric current is outputted from the photoelectric transfer circuit. The current-voltage transfer circuit transfers the photoelectric current into a voltage having a voltage value related to a current value of the photoelectric current. Thus, a color filter is provided which has a new filtering characteristic different from that of each of the color filter elments, in accordance with the synthesized photoelectric current.

In the color filter device according to the second aspect, lights transmitted through the color filter layers are incident on the photodiode region and are photoelectrically transferred. Produced photoelectric currents are elcetrically synthesized and a resultant photoelectric current is obtained from the first and second wiring layers. Thus, a color filter is provided which has a new filtering characteristic different from that of each of the color filter elements, in accordance with the synthesized photoelectric current.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
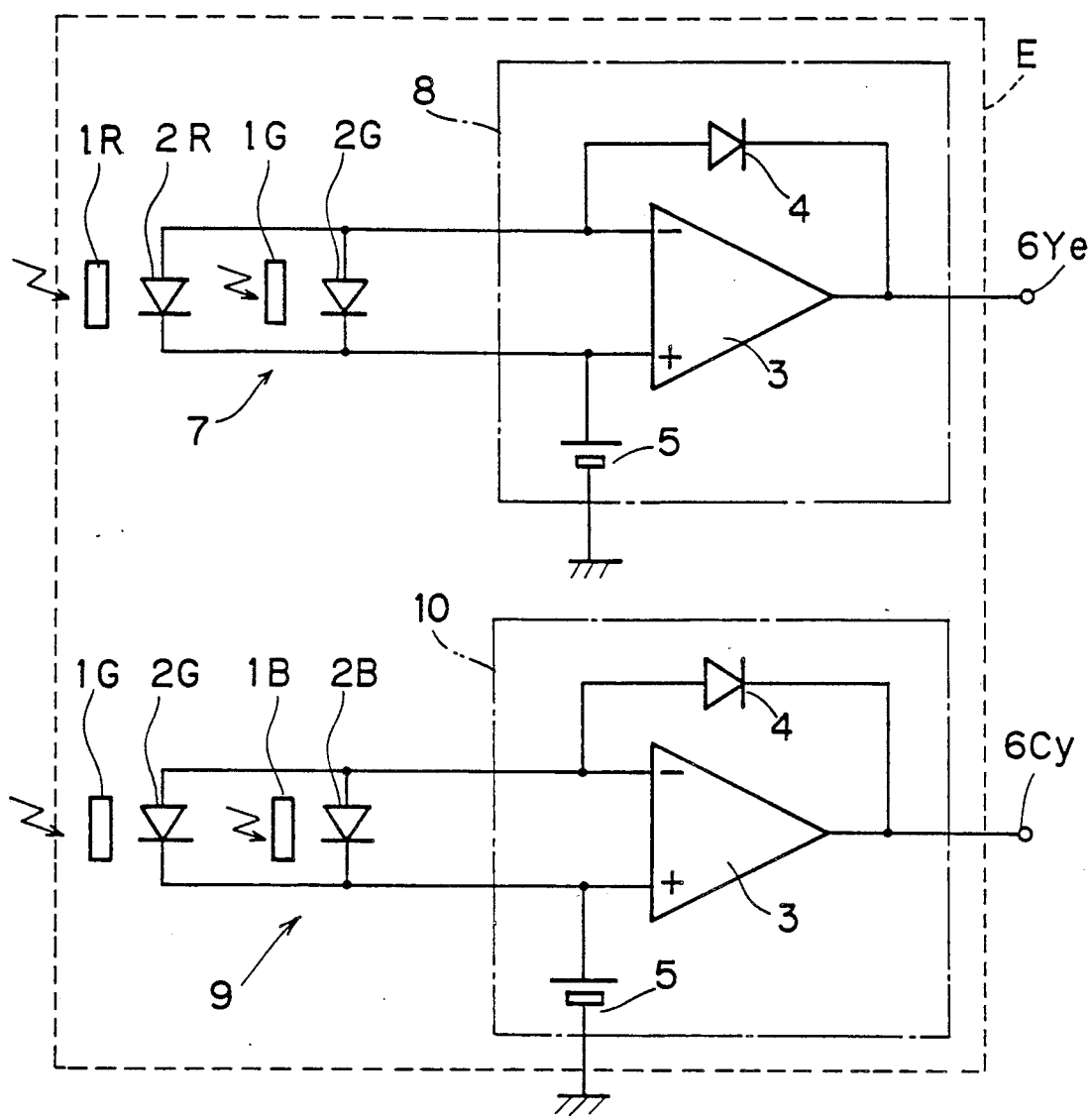
FIG. 1 is a diagram showing a construction of a color temperature sensor to which a first emobdiment of a color filter device according to the present invention is applied.

FIG. 1 is a diagram showing a construction of a color temperature sensor E to which a first embodiment of a color filter device according to the present invention is applied.

Figure 7:
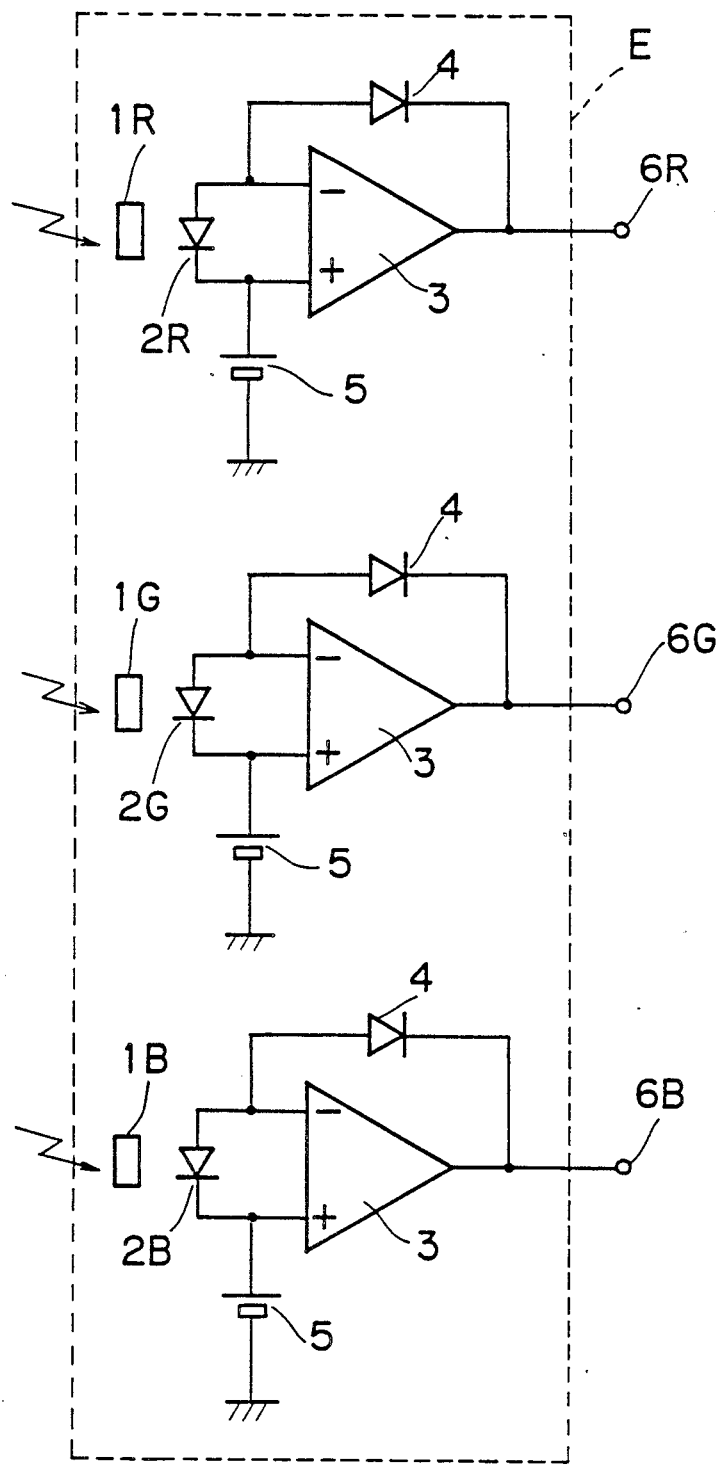
FIG. 7 is a diagram showing a conventional color temperature sensor.

An upper color filter device in FIG. 1 includes two photodiodes 2R, 2G in pairs with a red color filter element 1R and a green color filter element 1G. These photodiodes 2R, 2G are electrically connected in parallel to make a photoelectric transfer circuit 7. In the photoelectric transfer circuit 7, photoelectric currents generated by photoelectric transfer of the photodiodes 2R, 2G are synthesized and a resultant current is applied to a current-voltage transfer circuit 8 in the next stage. Similar to the prior art embodiment shown in FIG. 7, the current-voltage transfer circuit 8 includes an operational amplifier 3, a diode 4, and a constant voltage source 5. Additionally, an output terminal 6Ye is connected to the output side of the current-voltage transfer circuit 8. A lower color filter device in FIG. 1 is constructed similar to the above. That is, the color filter device includes two photodiodes 2G, 2B in pairs with a green color filter element 1G and a blue color filter elements 1B. These photodiodes 2G, 2B are electrically connected in parallel to make a photoelectric transfer circuit 9. In the photoelectric transfer circuit 9, photoelectric currents generated by photoelectric transfer of the photodiodes 2G, 2B are synthesized and a resultant current is applied to a current-voltage transfer circuit 10 in the next stage. The current-voltage transfer circuit 10 is constructed similar to the current-voltage transfer circuit 8, and an output terminal 6Cy is connected to its output side.

Figure 2:
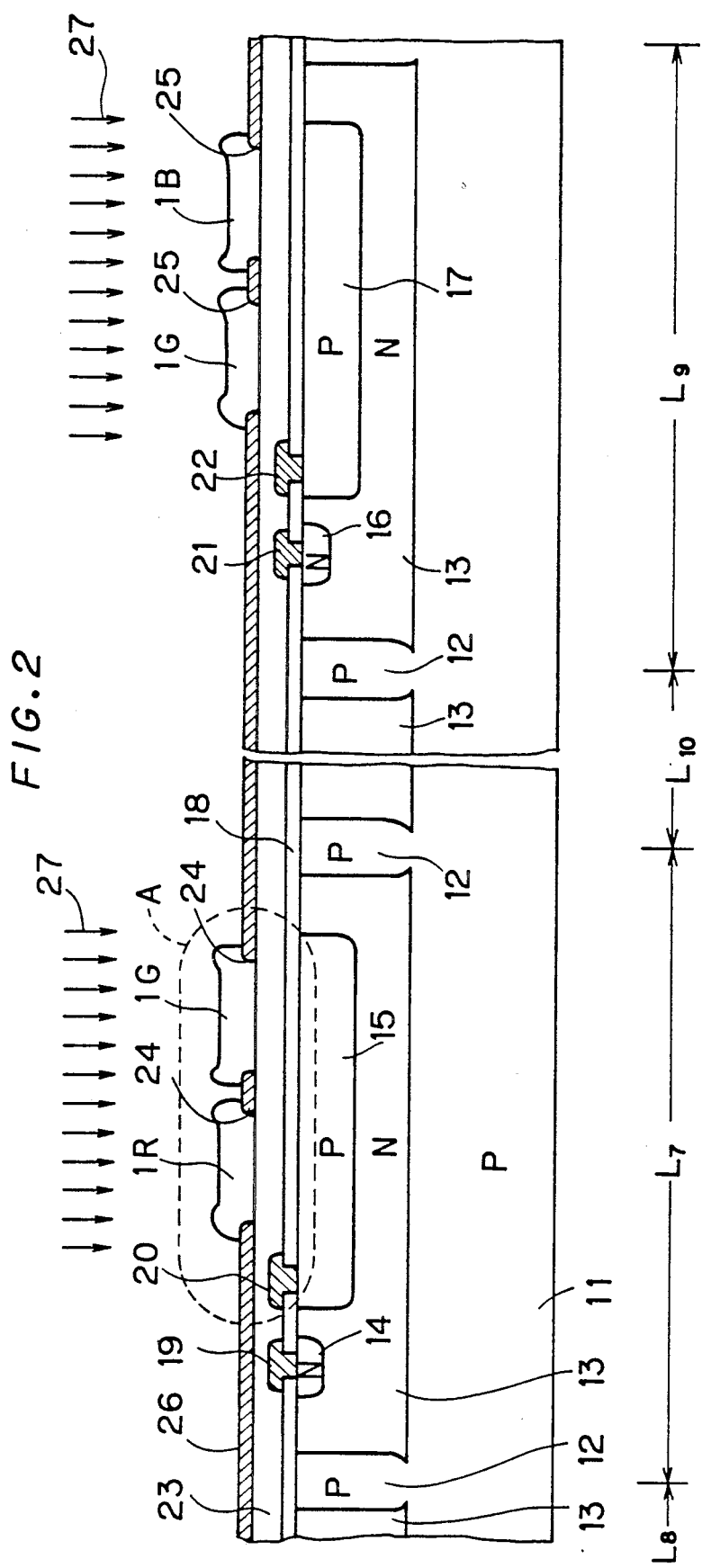
FIG. 2 is a sectional view showing an example of a device in which the color temperature sensor shown in FIG. 1 is implemented on one chip.

FIG. 2 is a sectional view showing an example of a device in which the color temperature sensor E shown in FIG. 1 is formed on one chip. As shown in FIG. 2, an N-type semiconductor region 13 of an epitaxial growth layer is formed on a P-type semiconductor substrate 11, and the N-type semiconductor region 13 is isolated into sections with p-type isolation regions 12. Each of the N-type semiconductor regions 13 is provided as a pre-device region for the photoelectric transfer circuits 7, 9 and the current-voltage transfer circuits 8, 10. Specifically, an N-type diffusion layer 14 for making an ohmic contact with the N-type semiconductor region 13 is selectively formed in a surface area of the N-type semiconductor region 13 corresponding to a section $L_7$ for the photoelectric transfer circuit 7 (see FIG. 2) and a P-type semiconductor region 15 for forming PN junctions of the photodiodes 2R, 2G is selectively formed in another surface area of the N-type semiconductor region 13 corresponding to the section $L_7$. Similarly, an N-type diffusion layer 16 for making an ohmic contact with the N-type semiconductor region 13 is selectively formed in a surface area of the N-type semiconductor region 13 corresponding to a section $L_9$ for the photoelectric transfer circuit 9 and a P-type semiconductor region 17 for forming PN junctions of the photodiodes 2G, 2B is selectively formed in another surface area of the N-type semiconductor region 13 corresponding to the section $L_9$.

A translucent insulation film 18 of $SiO_2$ is formed on the upper surfaces of the N-type semiconductor regions 13, N-type diffusion layers 14, 16, P-type semiconductor regions 15, 17 and P-type isolation regions 12. An Al wiring layer 19 which is an extension line from cathode electrodes of the photodiodes 2R, 2G and an Al wiring layer 20 which is an extension line from anode electrodes thereof are formed in a region on the insulation film 18 corresponding to the section $L_7$, respectively. Each of the Al wiring layers 19, 20 is electrically connected to the N-type diffusion layer 14 and P-type semiconductor region 15 through a contact hole provided in the insulation film 18. Similarly, an Al wiring layer 21 which is an extension line from cathode electrodes of the photodiodes 2G, 2B and an Al wiring layer 22 which is an extension line from anode electrodess thereof are formed in a region on the insulation film 18 corresponding to the section $L_9$, respectively. Each of the Al wiring layers 21, 22 is electrically connected to the N-type diffusion layer 16 and P-type semiconductor region 17 through a contact hole provided in the insulation film 18. A translucent insulation film 23 of $SiO_2$ is also formed over the Al wiring layers 19 to 22 on the insulation film 18. With there being formed two of openings 24 and openings 25 in regions on the insulation film 23 corresponding to the P-type semiconductor regions 15, 17, a light screening film 26 of Al is formed on the insulation film 23. Then, using the openings 24 formed in the section $L_7$, a red color filter layer of the red color filter element 1R and a green color filter layer of the green color filter element 1G are formed over the edge of the openings 24 of the light screening film 26 and the insulation film 23. Similarly, using the openings 25 formed in the section $L_9$, a green color filter layer of the green color filter element 1G and a blue color filter layer of the blue color filter element 1B are formed over the edge of the openings 25 of the light screening film 26 and the insulation film 23.

In regions corresponding to sections $L_8$, $L_{10}$, integrated circuits necessary for implementing the current-voltage transfer circuits 8, 10 shown in FIG. 1 are formed, respectively. Since a well-known construction is employed in those integrated circuits, illustration is omitted in FIG. 2. The Al wiring layers 19, 20 formed in the section $L_7$ are electrically connected to the current-voltage transfer circuit 8 formed in the section $L_8$ while the Al wiring layers 21, 22 formed in the section $L_9$ are electrically connected to the current-voltage transfer circuit 10 formed in the section $L_{10}$. Thus, the color temperature sensor E shown in FIG. 1 is formed.

Such a color temperature sensor E having the color filter device is exposed to light 27 as shown in FIG. 2. The irradiating light 27 pass through a part without the light screening film 26 into the device. In the section $L_7$, a light transmitted through the red color filter element 1R and a light transmitted through the green color filter element 1G reach a photodiode region (which corresponds to the photodiodes 2R, 2G shown in FIG. 1) consisting of the P-type semiconductor region 15 and N-type semiconductor region 13 in which the lights are photoelectrically transferred into photoelectric currents, respectively. Thus produced photoelectric currents are electrically synthesized, given at the Al wiring layers 19, 20 and inputted to the current-voltage transfer circuit 8 (FIG. 1). Since the current-voltage transfer circuit 8 has a construction similar to that of the prior art embodiment shown in FIG. 7, the synthesized photoelectric current is transferred into a voltage logarithmically compressed by the diode 4 and given at the output terminal 6Ye. In the section $L_9$, a light transmitted through the green color filter element 1G and a light transmitted through the blue color filter element 1B reach a photodiode region (which corresponds to the photodiodes 2G, 2B shown in FIG. 1) consisting of the P-type semiconductor region 17 and N-type semiconductor region 13 in which the lights are photoelectrically transferred into photoelectric currents, respectively. Thus produced photoelectric currents are electrically synthesized, given at the Al wiring layers 21, 22 and inputted to the current-voltage transfer circuit 10 (FIG. 1). A resultant photoelectric current is transferred into a voltage logarithmically compressed by the diode 4 and given at the output terminal 6Cy.

Figure 3A:
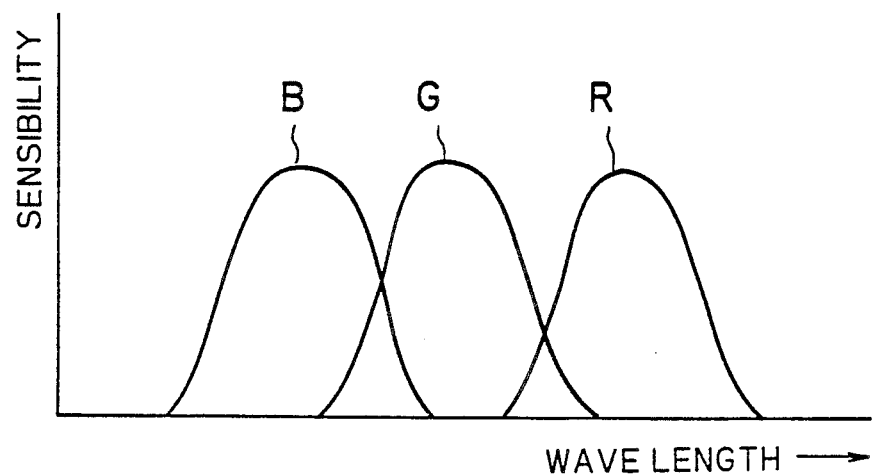
FIG. 3A is a diagram illustrating a filtering characteristic of red, green and blue color filter elements.
Figure 3B:
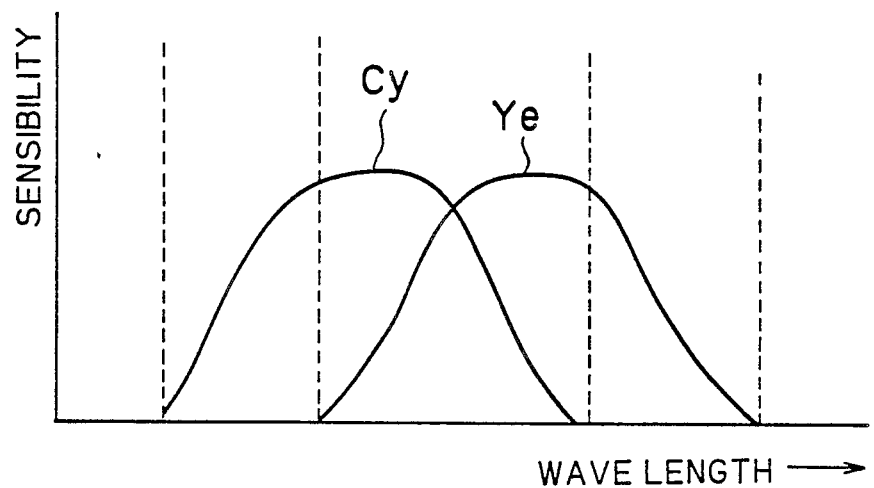
FIG. 3B is a digram illustrating a filtering chraracteristic of cyanogen and yellow obtained by the embodiment of the present invention.
Figure 3C:
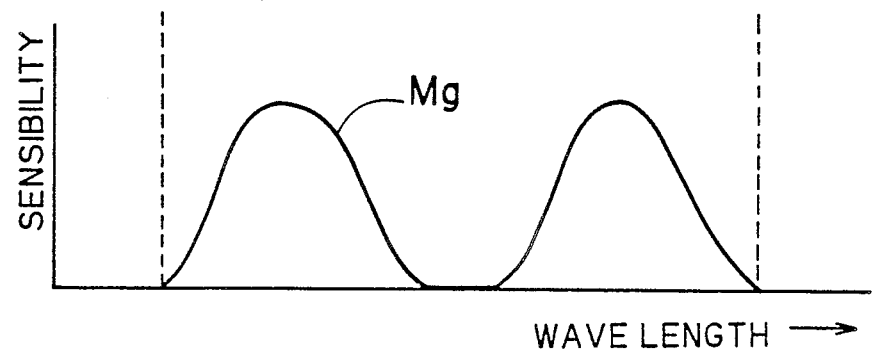
FIG. 3C is a diagram illustrating a filtering characteristic of magenta.

The above statement will be explained with reference to FIGS. 3A to 3C. Characteristic curves R, G, B in FIG. 3A represent an output characteristic of the photodiodes 2R, 2G, 2B shown in FIG. 1, respectively. Now note the photoelectric transfer circuit 7 formed in the section L7. Since the photoelectric current generated by synthesizing the photoelectric currents from the photodiodes 2R, 2G is given in the photoelectric transfer circuit 7, its output characteristic is represented by a curve Ye shown in FIG. 3B, which is given by synthesizing the output characteristics R and G in FIG. 3A. Similarly, an output characteristic of the photoelectric transfer circuit 9 formed in the section $L_9$ is represented by a curved Cy shown in FIG. 3B, which is given by synthesizing the output characteristics B and G in FIG. 3B. In this way, the output characteristic Ye equivalent to that of a yellow color filter is obtained by employing an existing red and green color filter elements 1R and 1G while the output characteristic Cy equivalent to that of a cyanogen color filter is obtained by employing an existing green and blue color filter elements 1G and 1B. Similarly, employing an existing blue and red color filter elements 1B and 1R, an output characteristic Mg (see FIG. 3C) equivalent to that of a magenta color filter can be obtained.

Also, when a plurality of color filter elements each of which has individual filtering characteristic are overlaid one over another into layers and the light transmitted through the layers is photoelectrically transferred, a color filter device having a new filtering characteristic different from those of the color filter elements can be obtained. In that case, however, transmittivity of light is significantly reduced and the size of the color filter layers become large in its overlaid direction because the total thickness of the color filter layers is increased. To the contrary, the color filter elements are formed in parallel on the chip in the above embodiment, and therefore the above mentioned problems do not occur.

A process of manufacturing the color temperature sensor shown in FIG. 2 will be described. Herein, a manufacturing process of a region corresponding to the sections $L_7$, $L_9$ will be explained because the current-voltage transfer circuit 8, 10 formed in the sections $L_8$, $L_{10}$ have a well-known construction and are manufactured similar to the conventional process.

First, a P-type semiconductor substrate 11 is prepared, and an N-type epitaxial layer is grown thereon. Then, a P-type impurity is selectively diffused from the surface of the N-type epitaxial layer to define the P-type isolation regions 12. Thus, N-type semiconductor regions 13 isolated by the P-type isolation regions 12 are formed in the epitaxial layer. After that, an N-type and P-type impurities are selectively diffused on the surfaces of the N-type semiconductor regions 13 in the sections $L_7$, $L_9$ one after another to form N-type diffusion layers 14, 16 and P-type semiconductor regions 15, 17, respectively.

On the chip which is provided with photodiodes in the sections $L_7$, $L_9$, an insulation film $SiO_2$ having contact holes is formed by means of the well-known photolithography. Further, Al wiring layers 19 to 22 are formed on the insulation film 18 by means of well-known photolithography. An insulation film 23 of $SiO_2$ is further formed on the insulation film 18 over the Al wiring layers 19 to 22.

Then, a light screening film 26 of Al having openings 24, 25 is formed on the insulation film 23 by means of the well-known photolithography. After that, the upper surface of the chip is coated with varnish which is a red color filter material, by a spin coater. After the varnish-coated chip is burnt, the burnt vanish is etched out except for a required part thereof by means of photolithography, so that a color filter layer as a red color filter elment 1R is formed in one of the openings 24. Further, the above sequence of treatments are performed using varnish which is a green color filter material instead of the varnish which is the red color filter material. As a result, color filter layers as green color filter elements 1G are formed in the other of the openings 24 and one of the openings 25. Similarly, the common treatments are performed using varnish which is a blue color filter material, so that a color filter layer as a blue color filter element 1B is formed in the other of the openings 25.

In the above embodiment, although an example in which the upper and lower filter devices shown in FIG. 1 are formed on one chip as shown in FIG. 2 has been described, the upper and lower color filter devices in FIG. 1 may be formed on separate chips. For example, it also is possible that the sections $L_7$, $L_8$ shown in FIG. 2 are formed on one chip while the sections $L_9$, $L_{10}$ are formed on another chip. In addition to that, the sections $L_7$ to $L_{10}$ may be formed on separate chips, respectively. In that case, external wiring may be utilized for electrically connecting between the chips.

In the above embodiment, although two of the color filter elments 1R, 1G are provided in the photodiode region consisting of the P-type semiconductor region 15 and the N-type semiconductor region 13, and the photoelectric currents based on the lights transmitted through the color filter elements 1R, 1G are synthesized in the photodiode region and the resultant photoelectric current is obtained at the Al wiring layers 19, 20, it also is possible that separate photodiode regions are provided corresponding to each of the color filter elements 1R, 1G and the photodiode regions are electrically connected in parallel using wirings so as to get a synthesized photoelectric current.

In the above embodiment, in the case that a passivation film is formed on at least one of the upper and lower surfaces of the color filter elements 1R, 1G, 1B, light interference in the passivation film is likely to have an adverse effect on the characteristic of the photoelectric current. In such a case, it is desirable to dispose a diffusion plate in the upper position of the color filter elements 1R, 1G, 1B.

Further, it is desirable, for example, to keep a long distance between the sections $L_7$ and $L_9$ in the light sreening film 26 so that the incident light from the color filter element 1R, 1G in the section $L_7$ may not be led to the photodiode region in the adjacent section $L_9$ through the insulation films 23, 18 as a propagation path.

Figure 4:
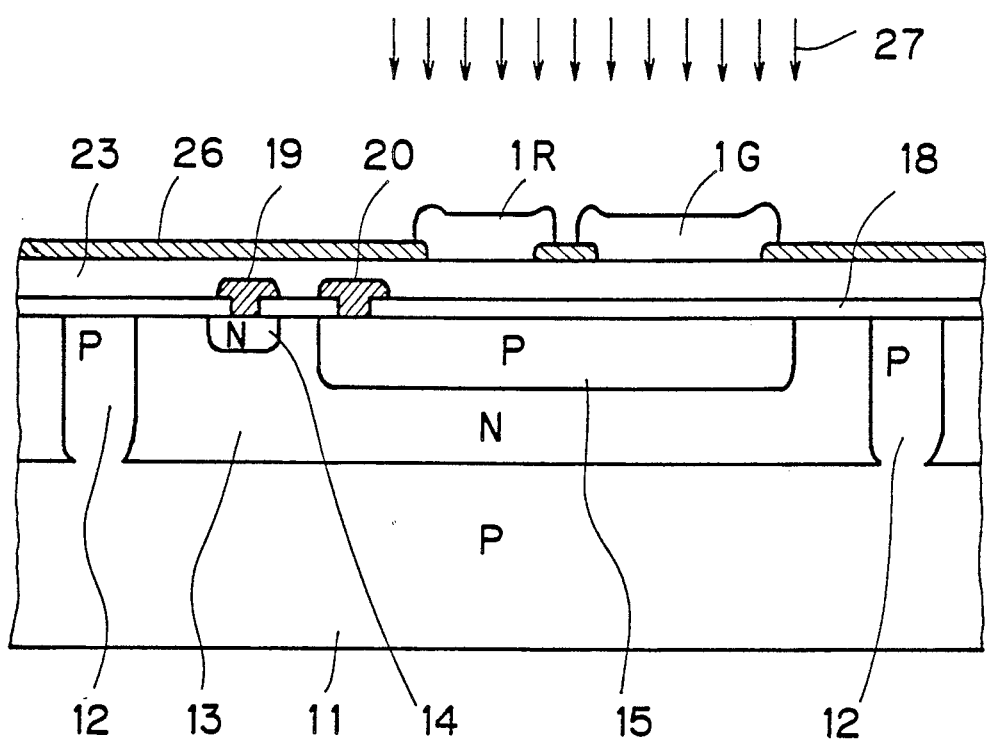
FIG. 4 is a sectional view of a color temperature sensor to which a second embodiment of the color filter device according to the present invention is applied.

FIG. 4 is a sectional view of a color temperature sensor to which a second embodiment of the color filter device according to the present invention is applied. In this device, a light receiving area of the green color filter element 1G formed on the photodiode is larger than that of the red color filter element 1R. Remaining part of the device construction is similar to that in the above first embodiment, and therefore, like or corresponding parts are represented with like reference numerals and the explanation about them is omitted. In this device, photoelectric currents depending upon light receiving areas of the red color filter elment 1R and the green color filter element 1G are synthesized and the resultant photoelectric current is obtained at the Al wiring layers 19, 20, and therefore, a color filter device having a filtering characteristic corresponding to the photoelectric current is obtained. Accordingly, a color filter device having various filtering characteristics is easily obtained by only adjusting a ratio of the light receiving area of each color filter element.

As a method of controlling a filtering characteristic profile by controlling the rate of the synthesized photoelectric current, the following is considered in addition to the above method. For example, in the device shown in FIG. 2, a light attenuation filter (ND filter) may be disposed above either one of the red and green color filter elements 1R, 1G to control the amount of light incident on the color filter element 1R of 1G. Alternatively, in the device shown in FIG. 2, for example, the sensitivity characteristic of the photodiode may be varied by adjusting the depth of impurity diffusion and concentration of impurity with the photodiode region corresponding to the red color filter element 1R and the photodiode region corresponding to the green color filter element 1G. Additionally, such an affect can be obtained by adjusting the light receiving area of the photodiode corresponding to each color filter element.

Figure 5:
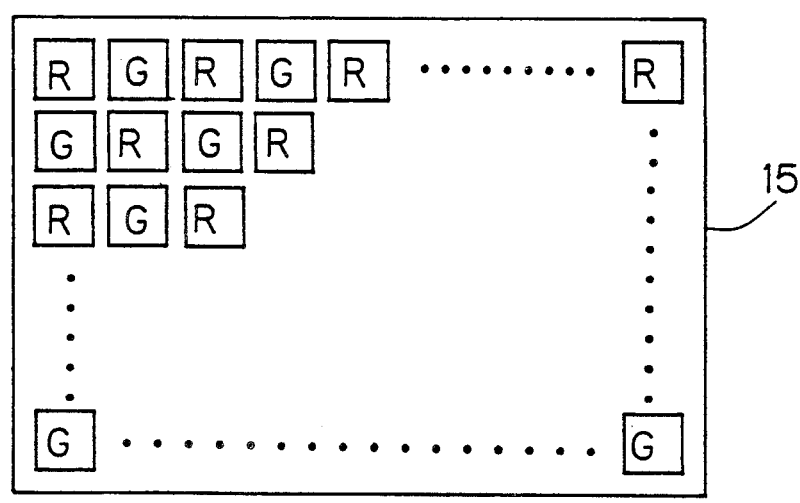
FIG. 5 is a typical top plan view showing a color filter region of a color temperature sensor to which a third embodiment of the color filter device according to the present invention is applied.

FIG. 5 is a typical top plan view showing a color filter region of a color temperature sensor to which a third embodiment of the present invention is applied. FIG. 5 corresponds to a diagram, seen from the upper side, of a region enclosed by a broken line A in FIG. 2. In this device, red color filter elements R and green color filter elements G are alternatively arranged in rows and columns to make a matrix within a region corresponding to the P-type semiconductor region 15 which works as a photodiode. Another part is similar to that in the first embodiment of FIG. 2. In this embodiment, even when a passivation film is formed on at least one of the upper and lower surface of the color filter elements R, G, for example, an adverse effect which light interference caused by the passivation film has on the filtering characteristic of the color filter device can be controlled. As a result, there is no need to provide a diffusion plate on the color filter elements R, G.

Figure 6:
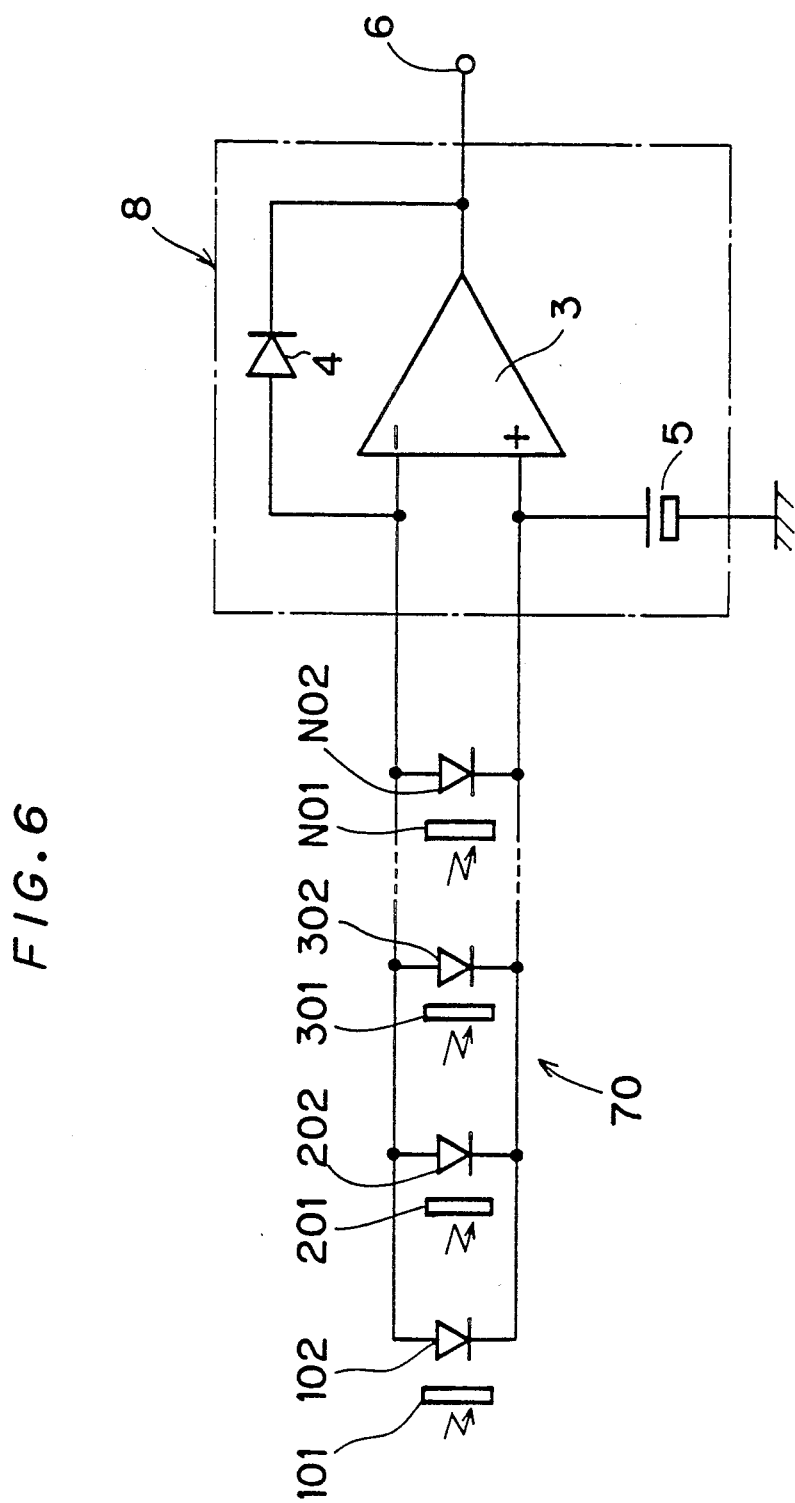
FIG. 6 is a diagram showing a construction of a fourth embodiment of the color filter device according to the present invention.

FIG. 6 is a diagram illustrating a construction of a fourth embodiment of a color filter device according to the present invention. As shown in FIG. 6, the color filter device includes a plurality of photodiodes 102, 202, 302, . . . , N02 in pairs with color filter elements 101, 201, 301, . . . , N01 each of which has individual filtering characteristic. These photodiodes 102, 202, 302, . . . , N02 are electrically connected in parallel to form a photoelectric transfer circuit 70. Since another part of the construction is similar to that of the embodiment shown in FIG. 1, like or corresponding parts are represented with like or corresponding reference numerals and the explanation about them is omitted. The color filter device provides an output characteristic corresponding to a photoelectric current obtained by synthesizing photoelectric currents which are caused by lights transmitted through the color filter elements 101, 201, 301, . . . , N01.

In each of the above embodiments, an infrared rays cut filter and a ultraviolet rays cut filter may be disposed above each color filter element to compensate for the filtering characteristic of the photodiode.

In each of the above embodiments, also, conductivity type of a P-type region and an N-type region may be inverted.

The foregoing description of the preferred embodiment of the present invention has been presented for purposes of illustration and description. It is not intended to the exhaustive or to limit the invention to the precise form disclosed. Obviously, many modifications will be apparent to practitioners skilled in this art.

What is claimed is:

1. A color filter device comprising,
a plurality of color filter elements each of which has individual filtering characteristic,
a photoelectric transfer circuit having a plurality of photodiodes electrically connected in paralled in pairs with said plurality of color filter elements, for synthesizing photoelectric currents caused by photoelectric transfer of the photodiodes and for outputting a resultant photoelectric current,
a current-voltage transfer circuit for transferring a current of a signal outputted from said photoelectric transfer circuit into a voltage thereof.

2. A color filter deivce according to claim 1, wherein said color filter elements include a red color filter element and a green color filter element, a green color filter element and a blue color filter element, or a blue color filter element and a red color filter element.

3. A color filter device according to claim 1, wherein said current-voltage transfer circuit includes a diode for transferring a current value into a voltage value by longarithmic compression.

4. A color filter device comprising,
a photodiode region including a first conductivity type semiconductor region and a second conductivity type semiconductor region selectively formed on the upper portion of said first conductivity type semiconductor region,
a first translucent insulation film which is formed converting said photodiode region from the first conductivity type semiconductor region to the second conductivity type semiconductor region,
a first wiring layer formed on said first insulation film and electrically connected to said first conductivity type semiconductor region through a contact hole provided in the first insulation film,
a second wiring layer formed on said first insulation film and electrically connected to said second conductivity type semiconductor region through a contact hole provided in said first insualtion film,
a second translucent insulation film formed on said first insulation film with covering said first and second wiring layers,
a light screening film formed on said second insulation film and provided with a plurality of openings in a region corresponding to said second conductivity type semiconductor region, and
a plurality of color filter layers which are formed on said second insulation film through said plurality of openings respectively and each of which has individual filtering characteristic.

5. A color filter device according to claim 4, wherein all of said plurality of color filter layers have the same light receiving area.

6. A color filter device according to claim 4, wherein at least one of said plurality of color filter layers has a light receiving area different from that of other color filter layers.

7. A color filter device according to claim 4, wherein a light attenuation filter is provided above at least one of said plurality of color filter layers.

8. A color filter device according to claim 4, wherein a diffusion plate is provided above each of said color filter layers.

9. A color filter device according to claim 4, wherein at least either one of a ultraviolet rays cut filter or an infrared rays cut filter is provided above each of said color filter layers.

10. A color filter device according to claim 4, wherein said plurality of openings are disposed in a form of matrix in a region corresponding to said second conductivity type semiconductor region, and two types of said color filter layers are provided alternately along the row and column directions of the matrix.

* * * * *